US012707726B2

(12) United States Patent
Huang et al.

(10) Patent No.: US 12,707,726 B2
(45) Date of Patent: Aug. 11, 2026

(54) ELECTROSTATIC DISCHARGE (ESD) PROTECTION STRUCTURE

(71) Applicant: MEDIATEK INC., Hsinchu City (TW)

(72) Inventors: Han-Sheng Huang, Hsinchu City (TW); Bo-Shih Huang, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 364 days.

(21) Appl. No.: 18/544,764

(22) Filed: Dec. 19, 2023

(65) Prior Publication Data

US 2024/0243120 A1 Jul. 18, 2024

Related U.S. Application Data

(60) Provisional application No. 63/480,317, filed on Jan. 18, 2023.

(51) Int. Cl.
*H10D 89/60* (2025.01)

(52) U.S. Cl.
CPC ................................ *H10D 89/813* (2025.01)

(58) Field of Classification Search
CPC ... H10D 89/813; H10D 89/611; H10D 89/713
See application file for complete search history.

(56) References Cited

U.S. PATENT DOCUMENTS 10,446,538 B2 10/2019 Zhou
10,504,886 B1 * 12/2019 Yam .................... H10D 62/129
2012/0319164 A1 * 12/2012 Inaba .................. H10D 18/031 257/173
2018/0053760 A1 * 2/2018 Ker ......................... H10D 8/00
2020/0235088 A1 7/2020 Huang
2021/0375866 A1 * 12/2021 Liaw ...................... H10D 89/10
2022/0271028 A1 8/2022 Gauthier, Jr.
2024/0170581 A1 * 5/2024 Huang .................. H10D 8/411

FOREIGN PATENT DOCUMENTS

CN 106952901 A 7/2017
CN 114709210 A 7/2022
WO 2020/047903 A1 3/2020

OTHER PUBLICATIONS

Chinese language office action dated Oct. 7, 2024, issued in application No. TW 113101687.

* cited by examiner

*Primary Examiner* — Shahan Ur Rahaman
(74) *Attorney, Agent, or Firm* — McClure, Qualey & Rodack, LLP

(57) ABSTRACT

Electrostatic discharge (ESD) protection structures are provided. A first N-type well region is formed over a P-type semiconductor substrate. First P-type well region and second N-type well region are formed over the first N-type well region. A plurality of first device areas are formed over the first P-type well region. Each first device area includes a plurality of P-type fins extending in a first direction. The P-type fins are divided into a plurality of first groups in each of the first device areas. A second device area is formed over the first P-type well region, and includes a plurality of N-type fins extending in the first direction and surrounded by the first device areas. When an ESD event is present, an ESD current flows sequentially through the P-type fins, the first P-type well region and the N-type fins.

10 Claims, 6 Drawing Sheets

ELECTROSTATIC DISCHARGE (ESD) PROTECTION STRUCTURE

CROSS REFERENCE TO RELATED APPLICATIONS

This application claims the benefit of U.S. Provisional Application No. 63/480,317, filed Jan. 18, 2023, the entirety of which is incorporated by reference herein.

BACKGROUND OF THE INVENTION

Field of the Invention

The present invention relates to an electrostatic discharge (ESD) protection structure, and, in particular, to an ESD protection structure having fin-based ESD diodes.

Description of the Related Art

An electrostatic discharge (ESD) event is an important reliability issue for integrated circuits (ICs). To meet the requirements on component-level ESD reliability, on-chip ESD protection circuits are implemented in the input/output (I/O) cells and power/ground cells of ICs.

With the continued miniaturization of ICs, ICs increasingly include powerful and efficient on-board data storage and logic circuitry for signal control and processing. In the course of IC evolution, functional density (i.e., the number of interconnected devices per chip area) has generally increased while geometric size (i.e., the smallest component (or line) that can be created using a fabrication process) has decreased. However, the advanced ICs also become more susceptible to ESD damage. ESD phenomenon occurs when excess charges are transmitted from the I/O pin to the integrated circuit too quickly, which damages the internal circuit. Therefore, ESD protection structures and circuits are built onto the chip to protect the devices and circuits of the IC against ESD damage.

BRIEF SUMMARY OF THE INVENTION

An embodiment of the present invention provides an electrostatic discharge (ESD) protection structure. A first N-type well region is formed over a P-type semiconductor substrate. A first P-type well region is formed over the first N-type well region. A second N-type well region is formed over the first N-type well region and surrounding the first P-type well region. A plurality of first device areas are formed over the first P-type well region. Each of the first device areas includes a plurality of P-type fins extending in a first direction. The P-type fins are divided into a plurality of first groups in each of the first device areas. A second device area is formed over the first P-type well region, and includes a plurality of N-type fins extending in the first direction and surrounded by the first device areas. The N-type fins are divided into a plurality of second groups in the second device area. A plurality of first metal lines are formed in a metal layer and extending in the first direction. Each of the first metal lines overlaps individual first device area. A second metal line is formed in the metal layer and extending in the first direction. The second metal line overlaps the second device area. When an ESD event is present, an ESD current flows from the first metal lines to the second metal line through the P-type fins, the first P-type well region and the N-type fins in sequence.

Furthermore, an embodiment of the present invention provides an electrostatic discharge (ESD) protection structure. A first N-type well region is formed over a P-type semiconductor substrate. A first P-type well region is formed over the first N-type well region. A second N-type well region is formed over the first N-type well region and surrounding the first P-type well region. A first device area is formed over the first P-type well region, and includes a plurality of P-type fins extending in a first direction. The P-type fins are divided into a plurality of first groups in the first device area. A plurality of second device areas are formed over the second N-type well region, and each of the second device areas includes a plurality of N-type fins extending in the first direction. The N-type fins are divided into a plurality of second groups in each of the second device areas, and the first device area is surrounded by the second device areas. A first metal line is formed in a metal layer and extending in the first direction. The first metal line overlaps the first device area. A plurality of second metal lines are formed in the metal layer and extending in the first direction, and each of the second metal lines overlaps individual second device area. When an ESD event is present, an ESD current flows from the first metal line to the second metal lines through the P-type fins, the first P-type well region, the second N-type well region and the N-type fins in sequence.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as “beneath,” “below,” “lower,” “above,” “upper” and the like, may be used herein for ease of description to describe one element or feature's relationship to another element(s) or feature(s) as illustrated in the figures.

Semiconductor devices employing higher device integration density, such as fin-base field effect transistor (FinFET) semiconductor devices. FinFET NMOS and/or PMOS transistors are formed in oxide definition (OD) regions. The OD region, sometimes labeled as an "oxide diffusion" area, defines an active region for the transistor, i.e., the region where the source, drain and channel under the gate of transistor are formed. The active region is defined to be between inactive areas, such as shallow trench isolation (STI) or field oxide (FOX) region.

Figure 1:
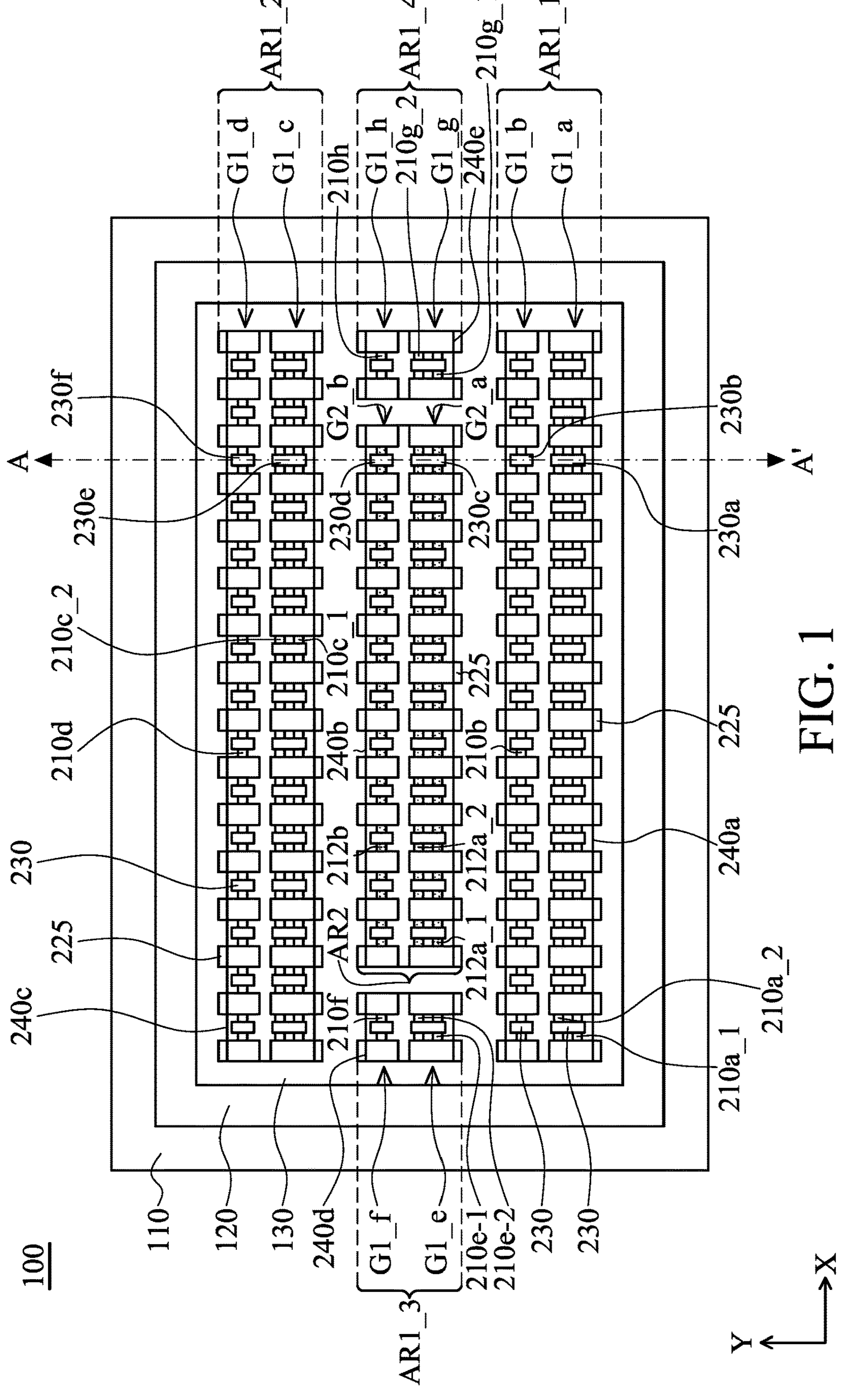
FIG. 1 is a top view of an electrostatic discharge (ESD) protection structure in an IC according to some embodiments of the invention.

FIG. 1 is a top view of an electrostatic discharge (ESD) protection structure 100 in an IC according to some embodiments of the invention. The ESD protection structure 100 includes the first device areas AR1_1 through AR1_4 and the second device area AR2, and the second device area AR2 is surrounded by the first device areas AR1_1 through AR1_4. The first device areas AR1_1 through AR1_4 and the second device area AR2 are formed over the P-type well region 130. In some embodiments, the P-type well region 130 may be a lightly doped P-type well region. The P-type well region 130 is completely surrounded by the N-type well region 120, and the N-type well region 120 is completely surrounded by the P-type well region 110. Furthermore, the P-type well region 110 is shared by other devices of the IC. In some embodiments, the P-type well region 110 may be the P-type substrate.

Each of the first device areas AR1_1 through AR1_4 includes multiple P-type fins extending in X-direction, and the P-type fins are divided into multiple first groups G1. The first groups G1 may have the same or a different number of P-type fins. For example, the first device area AR1_1 includes the P-type fins 210*a*_1 and 210*a*_2 of the first group G1_*a* and the P-type fin 210*b* of the first group G1_*b*, and the first device area AR1_2 includes the P-type fins 210*c*_1 and 210*c*_2 of the first group G1_*c* and the P-type fin 210*d* of the first group G1_*d*. Moreover, the first device area AR1_3 includes the P-type fins 210*e*_1 and 210*e*_2 of the first group G1_*e* and the P-type fin 210*f* of the first group G1_*f*, and the first device area AR1_4 includes the P-type fins 210*g*_1 and 210*g*_2 of the first group G1_*g* and the P-type fin 210*h* of the first group G1_*h*.

The second device area AR2 includes multiple N-type fins extending in X-direction, and the N-type fins are divided into multiple second groups G2. The second groups G2 may have the same or a different number of N-type fins. For example, the second device area AR2 includes the N-type fins 212*a*_1 and 212*a*_2 of the second group G2_*a* and the N-type fin 212*b* of the second group G2_*b*.

In X-direction, the length of the P-type fins in the first device area AR1_1 is equal to the length of the P-type fins in the first device area AR1_2, and the length of the P-type fins in the first device area AR1_3 is equal to the length of the P-type fins in the first device area AR1_4. The second device area AR2 is sandwiched between the first device areas AR1_1 and AR1_2. The length of the P-type fins in the first device area AR1_1 is longer than the length of the N-type fins in the second device area AR2, and the length of the N-type fins in the second device area AR2 is longer than the length of the P-type fins in the first device area AR1_3.

In each of the first device areas AR1_1 through AR1_4 and the second device area AR2, the number of first groups G1 in each of the first device areas AR1_1 through AR1_4 is equal to the number of second groups G2 in the second device area AR2. Furthermore, the fin configurations of the first groups and second groups are the same, i.e., the group having the multiple fins is arranged between the groups having the single fin. For example, the first group G1_*c* of the first device area AR1_2 is disposed between the first group G1_*d* of the first device area AR1_2 and the second group G2_*b* of the second device area AR2, and the second group G2_*a* of the second device area AR2 is disposed between the second group G2_*b* of the second device area AR2 and the first group G1_*b* of the first device area AR1_1.

In FIG. 1, the gate structures 225 and the connecting features 230 extend in Y-direction and cross the fins of the corresponding first groups G1 or the corresponding second groups G2. In some embodiments, the length of the gate structures 225 is longer than the length of the connecting features 230 in Y-direction, and the width of the gate structures 225 is wider than the width of the connecting features 230 in X-direction. In the ESD protection structure 100, the number of gate structures 225 and connecting features 230 in each of the first device areas AR1_1 and AR1_2 is greater than the number of gate structures 225 and connecting features 230 in the second device area AR2. Furthermore, the number of gate structures 225 in each of the first device areas AR1_3 and AR1_4 is 2, and the number of connecting features 230 in each of the first device areas AR1_3 and AR1_4 is 1.

Each of the first device areas AR1_1 through AR1_4 and the second device area AR2 is coupled to the overlapping metal line. For example, the first device area AR1_1 is electrically coupled to the metal line 240*a*, and the metal line 240*a* overlaps the P-type fins of the first groups G1_*a* and G1_*b*. The second device area AR2 is electrically coupled to the metal line 240*b*, and the metal line 240*b* overlaps the N-type fins of the second groups G2_*a* and G2_*b*. The first device area AR1_2 is electrically coupled to the metal line 240*c*, and the metal line 240*c* overlaps the P-type fins of the first groups G1_*c* and G1_*d*. The first device area AR1_3 is electrically coupled to the metal line 240*d*, and the metal line 240*d* overlaps the P-type fins of the first groups G1_*e* and G1_*f*. The first device area AR1_4 is electrically coupled to the metal line 240*e*, and the metal line 240*e* overlaps the P-type fins of the first groups G1_*h* and G1_*g*.

The metal lines 240*a* through 240*e* are formed in the one or more metal layers and extend in X-direction. For example, the metal lines 240*a* through 240*e* are formed in a single metal layer or distributed in some different metal layers. The metal lines 240*a*, 240*c*, 240*d* and 240*e* corresponding to the first device areas AR1_1 through AR1_4 are coupled to the ground pad (not shown) of the IC by the upper interconnection structure (not shown), and the metal line 240*b* corresponding to the second device area AR2 is coupled to the I/O pad (not shown) of the IC by the upper interconnection structure (not shown).

Figure 2:
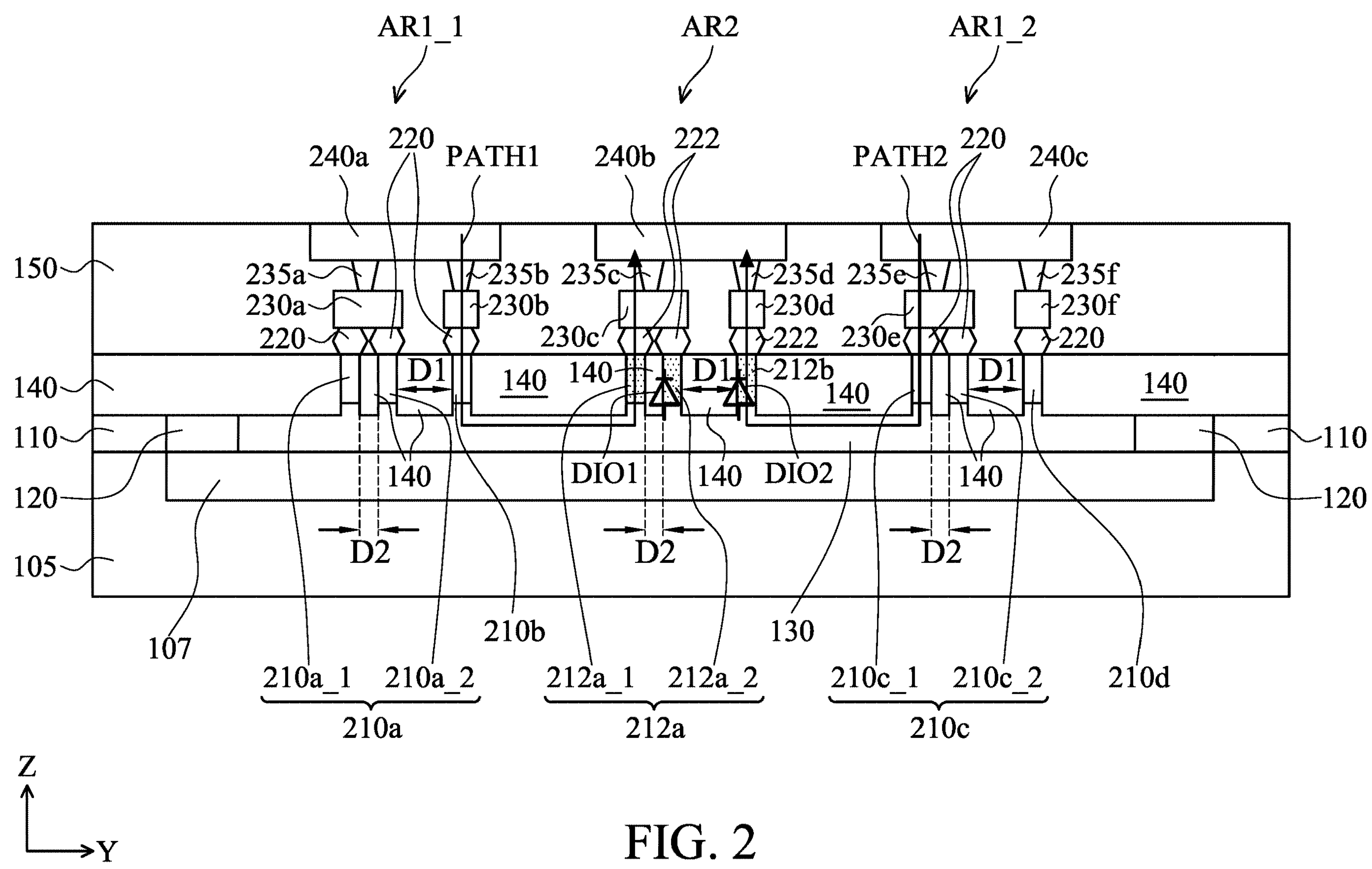
FIG. 2 is a cross-sectional view of the ESD protection structure along line A-A' of FIG. 1 according to some embodiments of the invention.

FIG. 2 is a cross-sectional view of the ESD protection structure 100 along line A-A' of FIG. 1 according to some embodiments of the invention. The deep N-type well region 107 is formed over a semiconductor substrate 105. In some embodiments, the semiconductor substrate 105 is a Si substrate, i.e., P-type substrate. In some embodiments, the material of the semiconductor substrate 105 is selected from a group consisting of bulk-Si, SiP, SiGe, SiC, SiPC, Ge, SOI—Si, SOI—SiGe, III-VI material, or a combination thereof.

The N-type well region 120 and the P-type well region 130 are formed over the deep N-type well region 107. Furthermore, the N-type well region 120 and the P-type well region 130 overlap the deep N-type well region 107 in Z-direction, and the P-type well region 130 is surrounded by the N-type well region 120. In some embodiments, the P-type well region 110 is formed over the semiconductor substrate 105 and does not overlap the deep N-type well region 107. Moreover, the bottom surfaces of the N-type well region 120 and the P-type well regions 110 and 130 are coplanar.

In FIG. 2, the P-type fins 210*a* through 210*d* of the first device areas AR1_1 and AR1_2 are formed over the P-type well region 130, and the P-type fins 210*a* through 210*d* are separated from each other by the STI 140. The epitaxially-grown materials 220 are epitaxially grown on the P-type fins 210*a* through 210*d*. In some embodiments, the epitaxially-grown materials 220 may include the materials with P-type conductivity, such as SiGe, SiGeC, Ge, Si, boron-doped SiGe, gallium-doped SiGe, boron and gallium doped SiGe, boron and carbon doped SiGe, or a combination thereof. Moreover, the epitaxially-grown materials 220 are the source/drain features of the P-type transistors formed by the gate structures 225 in the first device areas AR1_1 through AR1_4.

In the first device area AR1_1, the epitaxially-grown materials 220 corresponding to the P-type fins 210*a*_1 and 210*a*_2 are electrically connected together through the connecting feature 230*a*, and the connecting feature 230*a* is connected to the metal line 240*a* through the via 235*a*. Moreover, the epitaxially-grown material 220 corresponding to the P-type fin 210*b* is connected to the connecting feature 230*b*, and the connecting feature 230*b* is connected to the metal line 240*a* through the via 235*b*. The connecting features 230*a* and 230*b* may be the source/drain contacts formed in the same level. In the first device area AR1_1, the P-type fins 210*a*_1 and 210*a*_2 and the P-type fin 210*b* are electrically connected to the ground pad (not shown) through the metal line 240*a*. In some embodiments, the gate structures 225 in the first device area AR1_1 are also electrically connected to the ground pad (not shown) through the metal line 240*a*.

In the first device area AR1_2, the epitaxially-grown materials 220 corresponding to the P-type fins 210*c*_1 and 210*c*_2 are electrically connected together through the connecting feature 230*e*, and the connecting feature 230*e* is connected to the metal line 240*c* through the via 235*e*. Moreover, the epitaxially-grown material 220 corresponding to the P-type fin 210*d* is connected to the connecting feature 230*f*, and the connecting feature 230*f* is connected to the metal line 240*c* through the via 235*f*. The connecting features 230*e* and 230*f* may be the source/drain contacts formed in the same level. In the first device area AR1_2, the P-type fins 210*c*_1 and 210*c*_2 and the P-type fin 210*d* are electrically connected to the ground pad (not shown) through the metal line 240*c*. In other words, the metal line 240*c* is electrically connected to the metal line 240*a* through the upper interconnection structure (not shown). In some embodiments, the gate structures 225 in the first device area AR1_2 are also electrically connected to the ground pad (not shown) through the metal line 240*c*.

In FIG. 2, the N-type fins 212*a* and 212*b* of the second device area AR2 are formed over the P-type well region 130, and the N-type fins 212*a* and 212*b* are separated from each other by the STI 140. The epitaxially-grown materials 222 are epitaxially grown on the N-type fins 212*a* and 212*b*. In some embodiments, the epitaxially-grown materials 222 may include the materials with N-type conductivity, such as SiP, SiC, SiPC, SiAs, Si, antimony-doped SiP (SiP:Sb), antimony-doped SiAs (SiAs:Sb), or a combination thereof. Furthermore, the epitaxially-grown materials 222 are the source/drain features of the N-type transistors formed by the gate structures 225 in the second device area AR2.

In the second device area AR2, the epitaxially-grown materials 222 corresponding to the N-type fins 212*a*_1 and 212*a*_2 are electrically connected together through the connecting feature 230*c*, and the connecting feature 230*c* is connected to the metal line 240*b* through the via 235*c*. Moreover, the epitaxially-grown material 222 corresponding to the N-type fin 212*b* is connected to the connecting feature 230*d*, and the connecting feature 230*d* is connected to the metal line 240*b* through the via 235*d*. The connecting features 230*c* and 230*d* may be the source/drain contacts formed in the same level. In the second device area AR2, the N-type fins 212*a*_1 and 212*a*_2 and the N-type fin 212*b* are electrically connected to the I/O pad (not shown) through the metal line 240*b*. In some embodiments, the gate structures 225 in the second device area AR2 are also electrically connected to the I/O pad (not shown) through the metal line 240*b*. In some embodiments, an inter-layer dielectric (ILD) layer 150 is formed over the STI 140, the P-type fins 210*a* through 210*d*, and the N-type fins 212*a* and 212*b*. In some embodiments, the epitaxially-grown materials 220 and 222, the connecting features 230*a* through 230*f*, the vias 235*a* through 235*f*, and the metal lines 240*a* through 240*e* are formed in the ILD layer 150.

In each of the first and second device areas, the distance between the fins of two adjacent groups is D1. For example, in the first device area AR1_1, the distance between the P-type fin 210*b* of the first group G1_*b* and the P-type fin 210*a*_2 of the first group G1_*a* is D1. Similarly, in the second device area AR2, the distance between the N-type fin 212*b* of the second group G2_*b* and the N-type fin 212*a*_2 of the second group G2_*a* is D1. In each of the first and second groups having multiple fins, the distance between two adjacent fins is D2. For example, in the first device area AR1_1, the distance between the P-type fins 210*a*_1 and 210*a*_2 of the first group G1_*a* is D2. Similarly, in the second device area AR2, the distance between the N-type fins 212*a*_1 and 212*a*_2 of the second group G2_*a* is D2. It should be noted that the distance D1 is greater than the distance D2.

In the ESD protection structure 100, the anode of the diode DIO1 is formed by the P-type well region 130, and the cathode of the diode DIO1 is formed by the N-type fins 212*a*. In other words, a PN junction is formed between the P-type well region 130 and the N-type fins 212*a*. Moreover, the anode of the diode DIO2 is formed by the P-type well region 130, and the cathode of the diode DIO2 is formed by the N-type fin 212*b*. In other words, a PN junction is formed between the P-type well region 130 and the N-type fins 212*b*.

Compared with traditional FinFET ESD diode, the ESD diodes DIO1 and DIO2 are separated from the P-type substrate 105 and the P-type well region 110 that are shared with other devices (or all devices) in the IC by the deep N-type well region 107 and the N-type well region 120, thereby preventing the ESD current from the metal lines 240*a* and/or 240*c* to the metal line 240*b* (as shown in paths PATH1 and PATH2) from causing damage to other devices when an ESD event is present. In some embodiments, since the ESD diodes DIO1 and DIO2 are shunt together, the ESD diodes DIO1 and DIO2 can be regarded as a first equivalent diode. In some embodiments, the ESD protection structure 100 may further include an additional structure that has components constituting diodes similar to the ESD diodes DIO1 and DIO2. For example, the additional structure of the ESD protection structure 100 may include a P-type well region and several N-type fins that constitute a first diode and a second diode. The first and second diodes may be similar to the ESD diodes DIO1 and DIO2, and may be shunt together to from a second equivalent diode. In these embodiments, the second equivalent diode constituted by the first and second diodes may be configured to be in series with the first equivalent diode constituted by the ESD diodes DIO1 and DIO2. In this way, a diode string can be formed by the first and second equivalent diodes that are in series, and thus the turn-on voltage of ESD protection network can be increased. Since the distance D1 is greater than the distance D2, each of the metal lines 240*a* through 240*c* has wider width in the Y-direction to cover the entire groups of fins below, thereby bypassing more ESD current with the same metal current density. Furthermore, when the number of first groups in each first device area and the number of second groups in each second device area are increased, the widths of the overlapping metal lines are increased, thus bypassing more ESD current.

Figure 3:
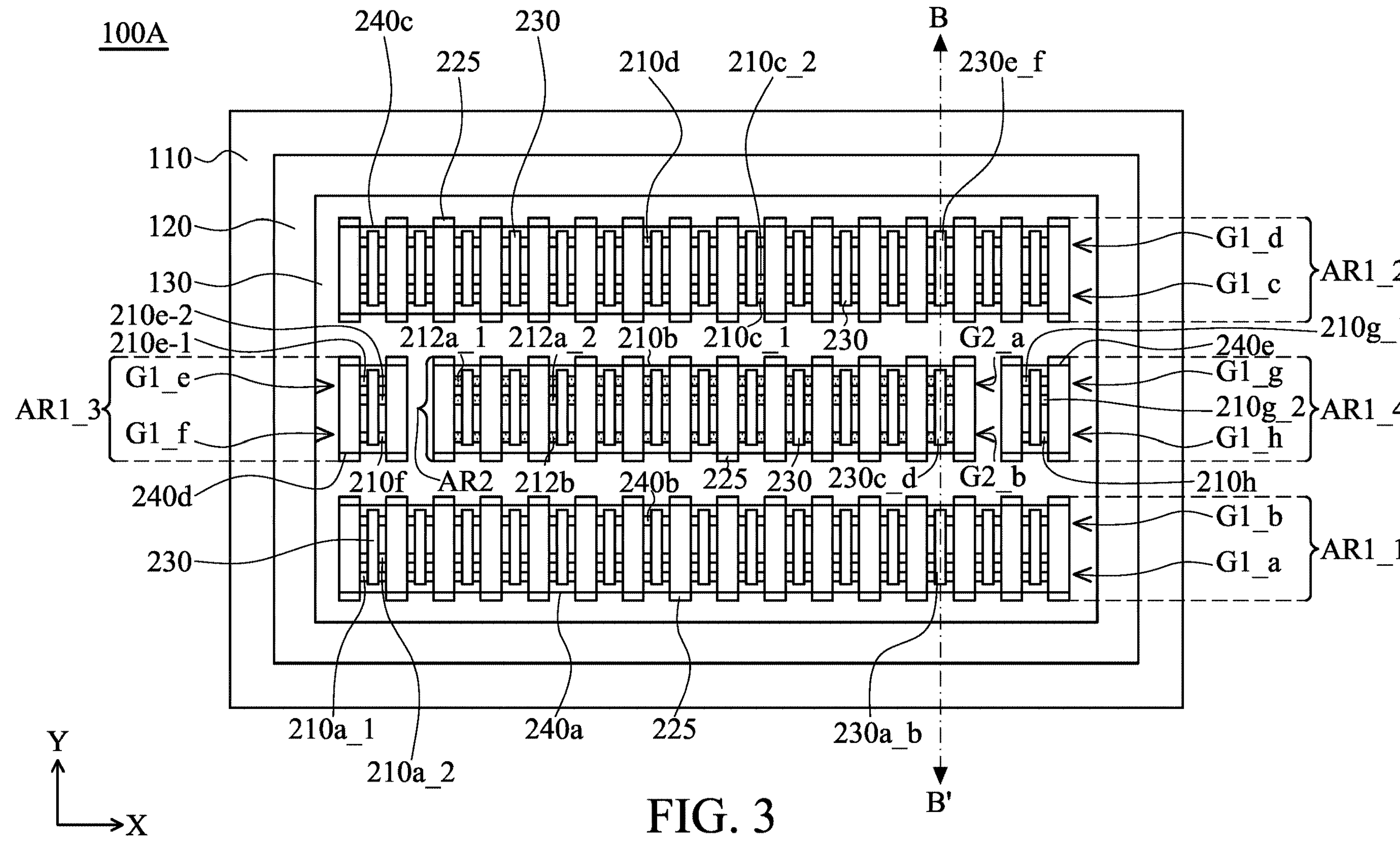
FIG. 3 is a top view of an ESD protection structure in an IC according to some embodiments of the invention.
Figure 4:
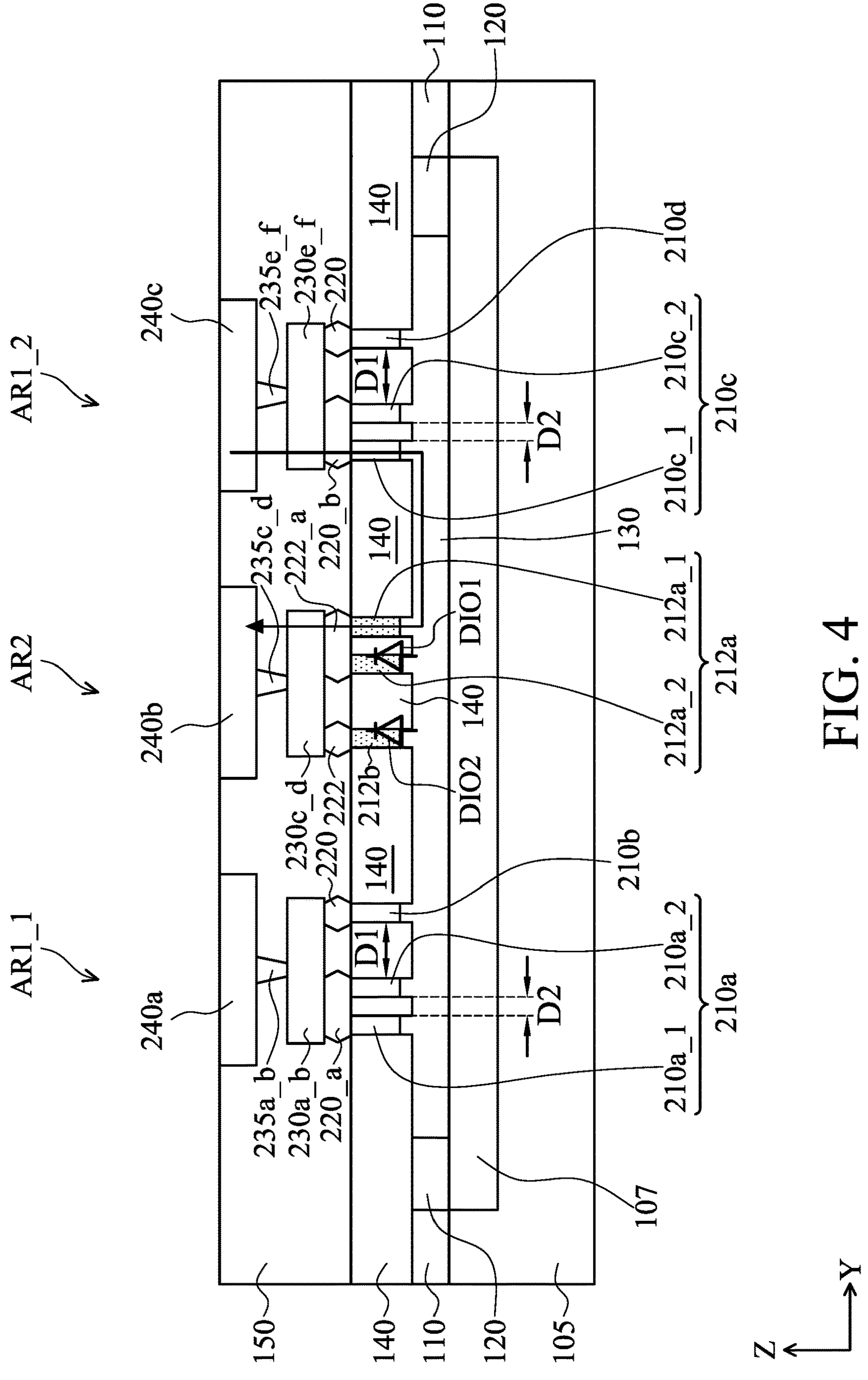
FIG. 4 is a cross-sectional view of the ESD protection structure along line B-B' of FIG. 3 according to some embodiments of the invention.

FIG. 3 is a top view of an ESD protection structure 100A in an IC according to some embodiments of the invention, and FIG. 4 is a cross-sectional view of the ESD protection structure 100A along line B-B' of FIG. 3 according to some embodiments of the invention. The configuration of the ESD protection structure 100A in FIGS. 3 and 4 is similar to the configuration of the ESD protection structure 100 in FIGS. 1 and 2, and the difference between the ESD protection structure 100A in FIGS. 3 and 4 and the ESD protection structure 100 in FIGS. 1 and 2 is that the fin configurations are irregular (or different), and each gate structure 225 and each connecting feature 230 cross the fins of all groups in the corresponding first/second device area.

In the ESD protection structure 100A, the fin configurations of the first device areas AR1_3 and AR_4 and the second device area AR2 are different from the fin configurations of the first device areas AR1_1 and AR_2. In such embodiment, the first group having the multiple P-type fins is close to the second group having the multiple N-type fins, and the first group having the single P-type fin is close to the second group having the single N-type fin. For example, the first group G1_*c* of the first device area AR1_2 is disposed between the first group G1_*d* of the first device area AR1_2 and the second group G2_*a* of the second device area AR2, and the second group G2_*b* of the second device area AR2 is disposed between the second group G2_*a* of the second device area AR2 and the first group G1_*b* of the first device area AR1_1. Similarly, the fin configurations of the first groups G1_*e* and G1_*f* in the first device area AR1_3 and the first groups G1_*g* and G1_*h* in the first device area AR1_4 are the same as the fin configuration of the second groups G2_*a* and G2_*b* of the second device area AR2.

In the first device area AR1_1 of FIG. 4, the P-type fins 210*a*_1 and 210*a*_2 are electrically connected together through the epitaxially-grown material 220_*a*, and the epitaxially-grown material 220_*a* is connected to the connecting feature 230*a*_*b*. Moreover, the epitaxially-grown material 220 corresponding to the P-type fin 210*b* is connected to the connecting feature 230*a*_*b*, and the connecting feature 230*a*_*b* is connected to the metal line 240*a* through the via 235*a*_*b*. In the first device area AR1_1, the P-type fins 210*a*_1 and 210*a*_2 and the P-type fin 210*b* are electrically connected to the ground pad (not shown) through the metal line 240*a*.

In the first device area AR1_2, the P-type fins 210*c*_1 and 210*c*_2 are electrically connected together through the epitaxially-grown material 220_*b*, and the epitaxially-grown material 220_*b* is connected to the connecting feature 230*e*_*f*. Moreover, the epitaxially-grown material 220 corresponding to the P-type fin 210*d* is connected to the connecting feature 230*e*_*f*, and the connecting feature 230*e*_*f* is connected to the metal line 240*c* through the via 235*e*_*f*. In the first device area AR1_2, the P-type fins 210*c*_1 and 210*c*_2 and the P-type fin 210*d* are electrically connected to the ground pad (not shown) through the metal line 240*c*.

In the second device area AR2, the N-type fins 212*a*_1 and 212*a*_2 are electrically connected together through the epitaxially-grown material 222_*a*, and the epitaxially-grown material 222_*a* is connected to the connecting feature 230*c*_*d*. Moreover, the epitaxially-grown material 222 corresponding to the N-type fin 212*b* is connected to the connecting feature 230*c*_*d*, and the connecting feature 230*c*_*d* is connected to the metal line 240*b* through the via 235*c*_*d*. In the second device area AR2, the N-type fins 212*a*_1 and 212*a*_2 and the N-type fin 212*b* are electrically connected to the I/O pad (not shown) through the metal line 240*b*. In FIG. 4, the epitaxially-grown materials 220_*a*, 220_*b* and 222_*a* are wider than the epitaxially-grown materials 220 and 222 in Y-direction.

Figure 5:
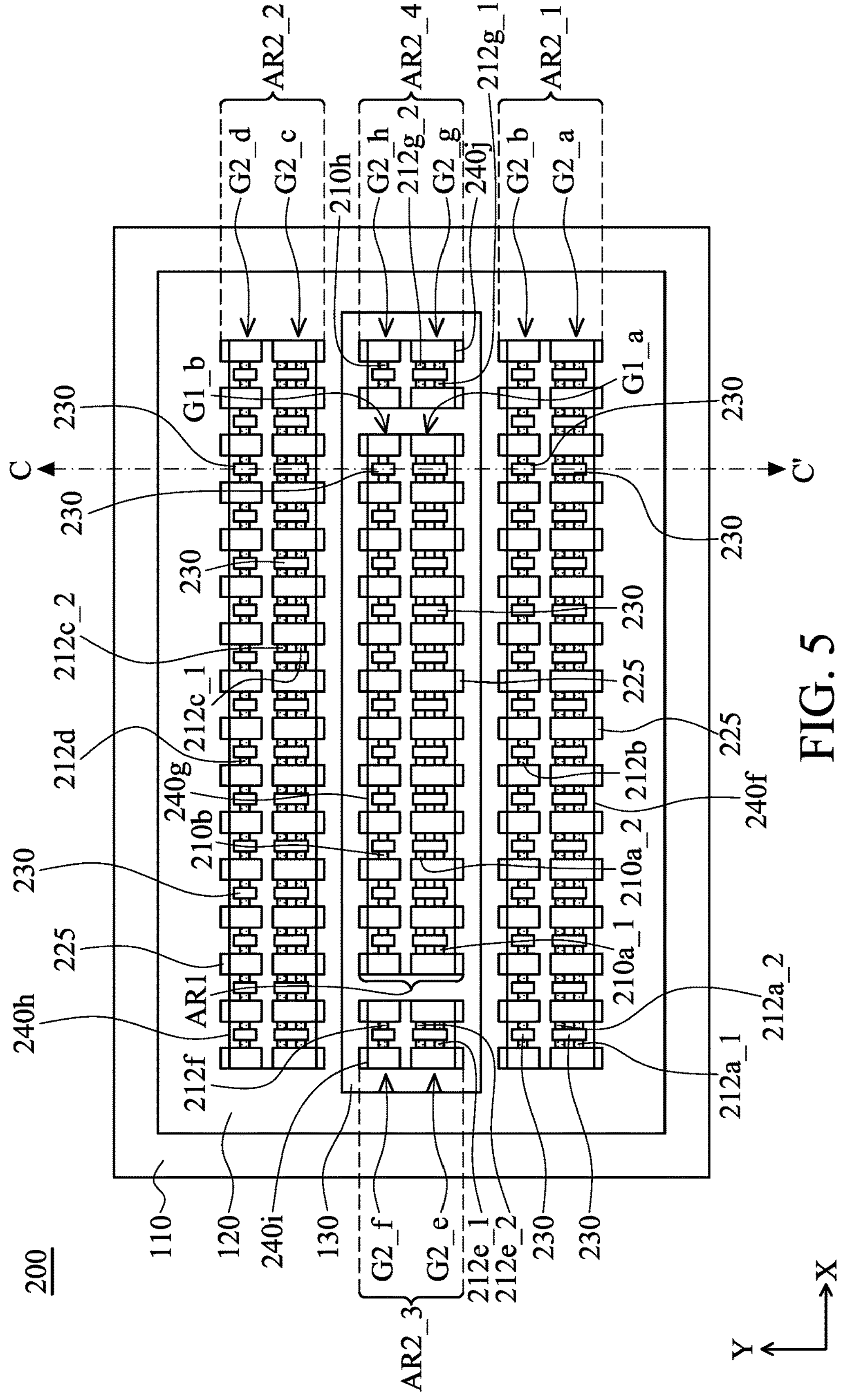
FIG. 5 is a top view of an ESD protection structure in the IC according to some embodiments of the invention.

FIG. 5 is a top view of an ESD protection structure 200 in the IC according to some embodiments of the invention. The ESD protection structure 200 includes the first device area AR1 and the second device areas AR2_1 through AR2_4, and the first device area AR1 is surrounded by the second device areas AR2_1 through AR2_4. The first device area AR1 is formed over the P-type well region 130, and the second device areas AR2_1 through AR2_4 are formed over the N-type well region 120. In some embodiments, the P-type well region 130 may be a lightly doped P-type well region. The P-type well region 130 is completely surrounded by the N-type well region 120, and the N-type well region 120 is completely surrounded by the P-type well region 110. Furthermore, the P-type well region 110 is shared by other devices of the IC. In some embodiments, the P-type well region 110 may be the P-type substrate.

As described above, the first device area AR1 includes multiple P-type fins extending in X-direction, and the P-type fins are divided into multiple first groups G1, and each of the second device areas AR2_1 through AR2_4 includes multiple N-type fins extending in X-direction and divided into multiple second groups G2. For example, the first device area AR1 includes the P-type fins 210*a*_1 and 210*a*_2 of the first group G1_*a* and the P-type fin 210*b* of the first group G1_*b*, and the second device area AR2_1 includes the N-type fins 212*a*_1 and 212*a*_2 of the second group G2_*a* and the N-type fin 212*b* of the second group G2_*b*.

In X-direction, the length of the N-type fins in the second device area AR2_1 is equal to the length of the N-type fins in the second device area AR2_2, and the length of the N-type fins in the second device area AR2_3 is equal to the length of the N-type fins in the second device area AR2_4. The length of the N-type fins in the second device area AR2_1 is longer than the length of the P-type fins in the first device area AR1, and the length of the P-type fins in the first device area AR1 is longer than the length of the N-type fins in the second device area AR2_3.

In each of the second device areas AR2_1 through AR2_4 and the first device area AR1, the fin configurations of the first group and second group are the same, i.e., the group having the multiple fins is arranged between the groups having the single fin. For example, the second group G2_*c* of the second device area AR2_2 is disposed between the second group G2_*d* of the second device area AR2_2 and the first group G1_*b* of the first device area AR1. In some embodiments, the fin configurations of the second device areas AR2_3 and AR2_4 and the first device area AR1 are different from the fin configurations of the second device areas AR2_1 and AR2_2.

In FIG. 5, the gate structures 225 and the connecting features 230 extend in Y-direction and cross the fins of the corresponding first groups G1 or the corresponding second groups G2. For example, each gate structure 225 and each connecting feature 230 are arranged to cross the fins in each first group G1 or each second group G2. In some embodiments, the length of the gate structures 225 is longer than the length of the connecting features 230 in Y-direction, and the width of the gate structures 225 is wider than the width of the connecting features 230 in X-direction. In some embodiments, each gate structure 225 and each connecting feature 230 extend to cross the fins in all first groups G1 in each first device area or all second groups G2 in each second device area, as shown in FIG. 3.

In ESD protection structure 200, each of the second device areas AR2_1 through AR2_4 and the first device area AR1 is coupled to the overlapping metal line. For example, the second device area AR2_1 is electrically coupled to the metal line 240*f*, and the metal line 240*f* overlaps the N-type fins of the second groups G2_*a* and G2_*b*. The first device area AR1 is electrically coupled to the metal line 240*g*, and the metal line 240*g* overlaps the P-type fins of the first groups G1_*a* and G1_*b*. The second device area AR2_2 is electrically coupled to the metal line 240*h*, and the metal line 240*h* overlaps the N-type fins of the second groups G2_*c* and G2_*d*. The second device area AR2_3 is electrically coupled to the metal line 240*i*, and the metal line 240*i* overlaps the N-type fins of the second groups G2_*e* and G2_*f*. The second device area AR2_4 is electrically coupled to the metal line 240*j*, and the metal line 240*j* overlaps the N-type fins of the second groups G2_*h* and G2_*g*.

The metal lines 240*f* through 240*j* are formed in one or more metal layers and extend in X-direction. For example, the metal lines 240*f* through 240*j* are formed in a single metal layer or distributed in some different metal layers. The metal lines 240*f*, 240*h*, 240*i* and 240*j* corresponding to the second device areas AR2_1 through AR2_4 are coupled to the power pad (not shown) of the IC by the upper interconnection structure (not shown), and the metal line 240*g* corresponding to the first device area AR1 is coupled to the I/O pad (not shown) of the IC by the upper interconnection structure (not shown).

Figure 6:
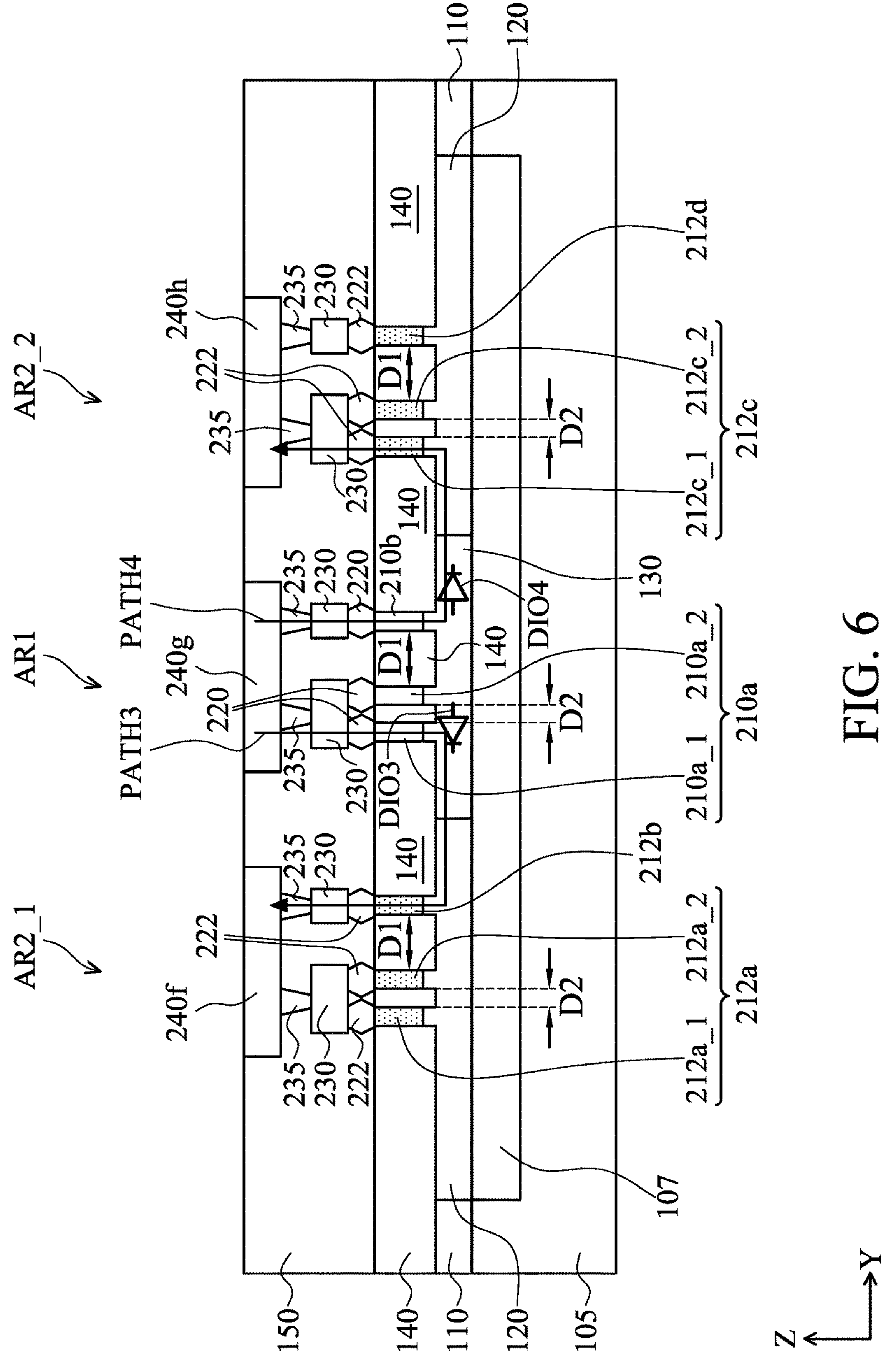
FIG. 6 is a cross-sectional view of the ESD protection structure along line C-C' of FIG. 5 according to some embodiments of the invention.

FIG. 6 is a cross-sectional view of the ESD protection structure 200 along line C-C' of FIG. 5 according to some embodiments of the invention. The deep N-type well region 107 is formed over the semiconductor substrate 105. In some embodiments, the semiconductor substrate 105 is a Si substrate, i.e., P-type substrate. The N-type well region 120 and the P-type well region 130 overlap the deep N-type well region 107 in Z-direction, and the P-type well region 130 is surrounded by the N-type well region 120. In some embodiments, the P-type well region 110 is formed over the semiconductor substrate 105 and does not overlap the deep N-type well region 107. Moreover, the bottom surfaces of the N-type well region 120 and the P-type well regions 110 and 130 are coplanar.

In FIG. 6, the N-type fins 212*a* through 212*d* of the second device areas AR2_1 and AR2_2 are formed over the N-type well region 120, and the N-type fins 212*a* through 212*d* are separated from each other by the STI 140. The epitaxially-grown materials 222 are epitaxially grown on the N-type fins 212*a* through 212*d*. Moreover, the epitaxially-grown materials 222 are the source/drain features of the N-type transistors formed by the gate structures 225 in the second device areas AR2_1 through AR2_4.

In the second device area AR2_1, the N-type fins 212*a*_1 and 212*a*_2 and the N-type fin 212*b* are electrically connected to the metal line 240*f* through the corresponding epitaxially-grown materials 222, the corresponding connecting features 230 and the corresponding vias 235, so as to electrically connected to the power pad (not shown). In the second device area AR2_2, the N-type fins 212*c*_1 and 212*c*_2 and the N-type fin 212*d* are electrically connected to the metal line 240*h* through the corresponding epitaxially-grown materials 222, the corresponding connecting features 230 and the corresponding vias 235, so as to electrically connect the power pad (not shown).

In FIG. 6, the P-type fins 210*a* and 210*b* of the first device area AR1 are formed over the P-type well region 130, and the P-type fins 210*a* and 210*b* are separated from each other by the STI 140. The epitaxially-grown materials 220 are epitaxially grown on the P-type fins 210*a* and 210*b*. Furthermore, the epitaxially-grown materials 220 are the source/drain features of the P-type transistors formed by the gate structures 225 in the first device area AR1.

In the first device area AR1, the P-type fins 210*a*_1 and 210*a*_2 and the P-type fin 210*b* are electrically connected to the metal line 240*g* through the corresponding epitaxially-grown materials 220, the corresponding connecting features 230 and the corresponding vias 235, so as to electrically connected to the I/O pad (not shown). In some embodiments, an ILD layer 150 is formed over the STI 140, the N-type fins 212*a* through 212*d*, and the P-type fins 210*a* and 210*b*. In some embodiments, the epitaxially-grown materials 220 and 222, the connecting features 230, the vias 235, and the metal lines 240*f* through 240*j* are formed in the ILD layer 150.

In each of the first and second device areas, the distance between the fins of two adjacent groups is D1. For example, in the second device area AR2_1, the distance between the N-type fin 212*b* of the second group G2_*b* and the N-type fin 212*a*_2 of the second group G2_*a* is D1. In each of the first and second groups having multiple fins, the distance between two adjacent fins is D2. For example, in the first device area AR1, the distance between the P-type fins 210*a*_1 and 210*a*_2 of the first group G1_*a* is D2. It should be noted that the distance D1 is greater than the distance D2.

In the ESD protection structure 200, the anode of the diode DIO3 is formed by the P-type well region 130, and the cathode of the diode DIO3 is formed by the N-type well region 120 on the left side of P-type well region 130. In other words, a PN junction is formed between the P-type well region 130 and the N-type well region 120 on the left side. Moreover, the anode of the diode DIO4 is formed by the P-type well region 130, and the cathode of the diode DIO4 is formed by the N-type well region 120 on the right side of P-type well region 130. In other words, a PN junction is formed between the P-type well region 130 and the N-type well region 120 on the right side.

Compared with traditional FinFET ESD diode, the ESD diodes DIO3 and DIO4 are separated from the P-type semiconductor substrate 105 and the P-type well region 110 that are shared with other devices (or all devices) in the IC by the deep N-type well region 107 and the N-type well region 120, thereby preventing the ESD current from the metal line 240*g* to the metal lines 240*f* and/or 240*h* to (as shown in paths PATH3 and PATH4) from causing damage to other devices when an ESD event is present. In some embodiments, since the ESD diodes DIO3 and DIO4 are shunt together, the ESD diodes DIO3 and DIO4 can be regarded as a first equivalent diode. In some embodiments, the ESD protection structure 200 may further include an additional structure that has components constituting diodes similar to the ESD diodes DIO3 and DIO4. For example, the additional structure of the ESD protection structure 200 may include a P-type well region surrounded by an N-type well region, and the P-type and N-type well region constitute a first diode and a second diode. The first and second diodes may be similar to the ESD diodes DIO3 and DIO4, and may be shunt together to from a second equivalent diode. In these embodiments, the second equivalent diode constituted by the first and second diodes may be configured to be in series with the first equivalent diode constituted by the ESD diodes DIO3 and DIO4. In this way, a diode string can be formed by the first and second equivalent diodes that are in series, and thus the turn-on voltage of ESD protection network can be increased. Since the distance D1 is greater than the distance D2, each of the metal lines **240*f* through 240*h*** has wider width in the Y-direction to cover the entire groups of fins below, thereby bypassing more ESD current with the same metal current density. Furthermore, when the number of first groups in each first device area and the number of second groups in each second device area are increased, the widths of the overlapping metal lines are increased, thus bypassing more ESD current.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection structure, comprising:

a P-type semiconductor substrate;

a first N-type well region formed over the P-type semiconductor substrate;

a first P-type well region formed over the first N-type well region;

a second N-type well region formed over the first N-type well region and surrounding the first P-type well region;

a plurality of first device areas over the first P-type well region, each comprising a plurality of P-type fins extending in a first direction, wherein the P-type fins are divided into a plurality of first groups in each of the first device areas;

a second device area over the first P-type well region, comprising a plurality of N-type fins extending in the first direction and surrounded by the first device areas, wherein the N-type fins are divided into a plurality of second groups in the second device area;

a plurality of first metal lines formed in a metal layer and extending in the first direction, wherein each of the first metal lines overlaps an individual first device area; and a second metal line formed in the metal layer and extending in the first direction, wherein the second metal line overlaps the second device area, wherein when an ESD event is present, an ESD current flows from the first metal lines to the second metal line through the P-type fins, the first P-type well region and the N-type fins in sequence.

2. The ESD protection structure as claimed in claim 1, further comprising:

a plurality of first connecting features, each extending in a second direction that is perpendicular to the first direction and overlapping the P-type fins of an individual first group; and a plurality of second connecting features, each extending in the second direction and overlapping the N-type fins of an individual second group, wherein the P-type fins in each of the first groups are electrically connected to the overlapping first metal line through the overlapping first connecting features and P-type epitaxially-grown materials between the overlapping first connecting features and the P-type fins, wherein the N-type fins in each of the second groups are electrically connected to the overlapping second metal line through the overlapping second connecting features and N-type epitaxially-grown materials between the overlapping second connecting features and the N-type fins.

3. The ESD protection structure as claimed in claim 1, further comprising:

a plurality of first connecting features, each extending in a second direction that is perpendicular to the first direction and overlapping the P-type fins of the first groups in an individual first device area; and a plurality of second connecting features, each extending in the second direction and overlapping the N-type fins of the second groups in the second device area, wherein the P-type fins in each of the first groups are electrically connected to the overlapping first metal line through the overlapping first connecting features and P-type epitaxially-grown materials between the overlapping first connecting features and the P-type fins, wherein the N-type fins in each of the second groups are electrically connected to the overlapping second metal line through the overlapping second connecting features and N-type epitaxially-grown materials between the overlapping second connecting features and the N-type fins.

4. The ESD protection structure as claimed in claim 1, wherein the first metal lines are electrically connected to a ground pad, and the second metal line is electrically connected to an input/output (I/O) pad.

5. The ESD protection structure as claimed in claim 1, wherein a PN junction is formed between the first P-type well region and the N-type fins.

6. The ESD protection structure as claimed in claim 1, wherein the first groups have a different number of P-type fins in each of the first device areas, and the second groups have a different number of N-type fins in the second device area.

7. The ESD protection structure as claimed in claim 1, wherein the first groups have the same number of P-type fins in each of the first device areas, and the second groups have the same number of N-type fins in the second device area.

8. The ESD protection structure as claimed in claim 1, wherein in each of the first device areas, a distance between the two adjacent P-type fins of the different first groups is greater than a distance between the two adjacent P-type fins of the same first group.

9. The ESD protection structure as claimed in claim 1, wherein in the second device area, a distance between the two adjacent N-type fins of the different second groups is greater than a distance between the two adjacent N-type fins of the same second group.

10. The ESD protection structure as claimed in claim 1, wherein the second device area is sandwiched between the first device areas, and the P-type fins of the first device areas are longer than the N-type fins of the second device area in the first direction.

* * * * *